(12) United States Patent
Tsunekawa et al.

(10) Patent No.: US 7,813,088 B2
(45) Date of Patent: Oct. 12, 2010

(54) MAGNETORESISTANCE EFFECT DEVICE

(75) Inventors: Koji Tsunekawa, Tokyo (JP); David D. Djayaprawira, Tokyo (JP)

(73) Assignee: Canon Anelva Corporation, Kawasaki-Shi, Kanagawa (JP)

( * ) Notice: Subject to any disclaimer, the term of this patent is extended or adjusted under 35 U.S.C. 154(b) by 777 days.

(21) Appl. No.: 11/527,532

(22) Filed: Sep. 27, 2006

(65) Prior Publication Data

US 2007/0070553 A1 Mar. 29, 2007

(30) Foreign Application Priority Data

Sep. 27, 2005 (JP) .............................. 2005-279559

(51) Int. Cl.
*G11B 5/127* (2006.01)
(52) U.S. Cl. ................................ 360/324.12
(58) Field of Classification Search ............ 360/324.12, 360/324.11, 324.1
See application file for complete search history.

(56) References Cited

U.S. PATENT DOCUMENTS

| | | | |
|---|---|---|---|
| 4,687,726 A | 8/1987 | Schlögl et al. | |
| 6,828,260 B2 | 12/2004 | Sharma et al. | |
| 6,831,314 B2 * | 12/2004 | Higo et al. | 257/295 |
| 6,844,999 B2 * | 1/2005 | Wang et al. | 360/324.12 |
| 6,885,540 B2 * | 4/2005 | Sakashita | 361/306.3 |
| 6,972,992 B1 * | 12/2005 | Fukuzumi et al. | 365/173 |
| 7,067,331 B2 * | 6/2006 | Slaughter et al. | 438/3 |
| 7,084,447 B2 * | 8/2006 | Fukuzumi et al. | 257/295 |
| 7,449,254 B2 * | 11/2008 | Spitsberg et al. | 428/701 |
| 2003/0011459 A1 * | 1/2003 | Hasegawa et al. | 336/200 |
| 2003/0103299 A1 * | 6/2003 | Saito | 360/324.12 |
| 2004/0001372 A1 * | 1/2004 | Higo et al. | 365/200 |
| 2004/0041183 A1 * | 3/2004 | Slaughter et al. | 257/295 |
| 2004/0042129 A1 * | 3/2004 | Mizuguchi et al. | 360/324.2 |
| 2004/0091743 A1 * | 5/2004 | Kula et al. | 428/692 |
| 2004/0166357 A1 * | 8/2004 | Sakashita | 428/615 |
| 2004/0245553 A1 | 12/2004 | Hosomi et al. | |
| 2005/0118458 A1 * | 6/2005 | Slaughter et al. | 428/692 |
| 2006/0017082 A1 * | 1/2006 | Fukuzumi et al. | 257/295 |
| 2006/0125034 A1 * | 6/2006 | Ohba et al. | 257/421 |

(Continued)

FOREIGN PATENT DOCUMENTS

EP 0 161 592 A2 11/1985

(Continued)

OTHER PUBLICATIONS

David D. Djayaprawira et al., "230% room-temperature magnetoresistance in CoFeB/MgO/CoFeB magnetic tunnel junctions", Applied Physics Letters 86, 2005, pp. 1-3.

(Continued)

*Primary Examiner*—Allen T Cao
(74) *Attorney, Agent, or Firm*—Buchanan Ingersoll & Rooney PC

(57) ABSTRACT

A magnetoresistance effect device has a fixed ferromagnetism layer, a free ferromagnetism layer, and a barrier layer sandwiched by these ferromagnetic layers. It is constituted so that CoFeB whose amount of addition of boron B (b: atomic %) is 21%≦b≦23% may be used for the free ferromagnetism layer. In the magnetic resistance effect element, a magnetostrictive constant does not change steeply near the magnetostrictive constant zero. A MR ratio is maintained to be high.

4 Claims, 5 Drawing Sheets

U.S. PATENT DOCUMENTS

| | | | |
|---|---|---|---|
| 2006/0187703 A1* | 8/2006 | Mizuguchi et al. | 365/158 |
| 2007/0128470 A1 | 6/2007 | Nagahama et al. | |
| 2007/0258170 A1* | 11/2007 | Yuasa | 360/324.2 |
| 2008/0006860 A1 | 1/2008 | Hosomi et al. | |
| 2009/0027810 A1* | 1/2009 | Horng et al. | 360/324.2 |
| 2009/0096043 A1* | 4/2009 | Min et al. | 257/421 |

FOREIGN PATENT DOCUMENTS

| | | |
|---|---|---|
| JP | 08-287422 | 11/1996 |
| JP | 2002-204004 A | 7/2002 |
| JP | 2002-289943 A | 10/2002 |
| JP | 2003-304010 | 10/2003 |
| JP | 2003-304010 A | 10/2003 |
| JP | 2003-318465 A | 11/2003 |
| JP | 2004-071186 A | 3/2004 |
| JP | 2004-153258 A | 5/2004 |
| WO | WO 01/56090 A1 | 8/2001 |

OTHER PUBLICATIONS

Djayaprawira et al., "230% Room Temperature Magnetoresistance in CoFeB/MgO/CoFeB Magnetic Tunnel Junctions," Technical Report of the Institute of Electronics, Information and Communication Engineers, vol. 104, 2005.

Matsumoto et al., "Tunneling spectra of sputter-deposited CoFeB/MgO/CoFeB magnetic tunnel junctions showing giant tunneling magnetoresistance effect", Solid State Communications, vol. 136, pp. 611-615, 2005.

Platt et al., "Spin Polarized Tunneling in Reactively Sputtered Tunnel Junctions", J. Appl. Phys. vol. 81, Apr. 15, 1997.

Yuasa et al., "High Tunnel Magnetoresistance at Room Temperature in Fully Epitaxial Fe/MgO/Fe Tunnel Junctions due to Coherent Spin-Polarized Tunneling".

Stuart S. P. Parkin et al.,"Giant Tunnelling Magnetoresistance at Room Temperature with MgO (100) Tunnel Barriers" Nature Materials , 2004, vol. 1 pp. 862-867.

* cited by examiner

AN AMOUNT OF ADDITION OF Ni [atomic %]

AN AMOUNT OF ADDITION OF Ni [atomic %]

MAGNETORESISTANCE EFFECT DEVICE

BACKGROUND OF THE INVENTION

1. Field of the Invention

The present invention relates to a magnetoresistance effect device, more particularly, relates to a magnetoresistance effect device used for a magnetic head, memory or the like, which is capable of making a magnetostrictive constant small with a MR ratio maintained to be high.

2. Description of the Related Art

A magnetoresistance effect device has been used for MRAM (Magnetic Random Access Memory) known as a nonvolatile memory, a magnetic head, a magnetic sensor or the like. The magnetoresistance effect device has fundamentally a film structure including a three-layer structure of a fixed ferromagnetism layer/a barrier layer/a free ferromagnetism layer. When passing an electric current between the two ferromagnetic layers in the magnetoresistance effect device, an electric resistance value of the device becomes a small value ($R_P$) if the directions of magnetization of the two ferromagnetic layers are parallel to a layer direction and the same, while the electric resistance value becomes a large value ($R_A$) if the above directions are parallel to the layer direction and opposite. The size in change of the electric resistance dependent on the direction of magnetization of the two ferromagnetic layers is indicated by a MR ratio, and this MR ratio is defined as a following formula.

$$MR\ \text{ratio}(\%) = (R_A - R_P) \times 100 \div R_P$$

In the MRAM, reading information is performed on the basis of a change of the electric resistance by the difference in the direction of magnetization of the two ferromagnetic layers in a TMR device. Therefore, the higher the MR ratio becomes, the larger is an output voltage of the MRAM.

Concerning the magnetoresistance effect device mentioned above, the inventors of the present invention have discovered a device with a very high MR ratio of 230%. This magnetoresistance effect device had a characteristic that amorphous CoFeB was used as the free ferromagnetism layer, a Magnesium Oxide (MgO) film was grown up for the barrier layer, and further film structure including the three-layers structure of CoFeB (fixed ferromagnetism layer)/MgO (middle layer)/CoFeB (free ferromagnetism layer). The MgO film had single crystal structure or high orientation polycrystal structure (fiber texture) without grain boundary in a thickness direction. In accordance with the magnetoresistance with the above characteristic structure, the MR ratio of 230% has been obtained. This fact was disclosed in the reference of "the Applied Physics Letters on Feb. 23, 2005 on-line issue", as the article of "230% room-temperature magnetoresistance in CoFeB/MgO/CoFeB magnetic tunnel junction" written by David D Djayaprawira, etc.

In the devices such as a magnetic head, a memory, a magnetic sensor or the like, there is a magnetostrictive constant as one of amounts of measurement to be managed for a good device operation. When setting a film stress as σ, a magnetostrictive constant as λ, and saturation magnetization as Ms concerning magnetic material, an anisotropy magnetic field "Hk" can be expressed by the following formula.

$$Hk = 3 \times |\lambda| \times \sigma / Ms$$

According to the above-mentioned formula, under the condition that the saturation magnetization Ms of the magnetic material is fixed, when both the film stress σ and magnetic distortion λ become large, it becomes clear that the anisotropy magnetic field Hk becomes large because of a reverse magnetostrictive effect.

The magnetic head is operated by applying the bias magnetic field of several hundreds Oe in the direction along the film surface of the free ferromagnetism layer. Since the anisotropy magnetic field Hk due to the reverse magnetostrictive effect gives perturbation to the bias magnetic field, it is requested that the anisotropy magnetic field Hk is controlled to be as small as possible, and further it is desirable to make it below 10 Oe in practical. Usually, since the film stress σ for the free ferromagnetism layer is below about 300 MPa, it is needed to make the value of the magnetostrictive constant included in a range of $\pm 1.0 \times 10^{-6}$ in order to make the anisotropy magnetic field Hk below 10 Oe.

When measuring the magnetostrictive constant of the CoFeB film which is the free ferromagnetism layer of the magnetoresistance effect device described in the above-mentioned reference, it became clear that the absolute value of the magnetostrictive constant is considerably larger than $1.0 \times 10^{-6}$. If the absolute value of the magnetostrictive constant of the free ferromagnetism layer is larger than $1.0 \times 10^{-6}$, it becomes impossible to cause the units including the magnetoresistance effect device to operate with required performances because the free ferromagnetism layer gives a bad influence on the operation of the units. Then, it is required to reduce the magnetostrictive constant of the free ferromagnetism layer in the magnetoresistance effect device.

In view of the above situations, in order to reduce the magnetostrictive constant of the free ferromagnetism layer of the magnetoresistance effect device, the inventors carried out laminating a NiFe film, which is known to have a small magnetostrictive constant, to the free ferromagnetism layer CoFeB, and tried to measure the magnetostrictive constant of two-layer laminated films "CoFeB/NiFe". In accordance with the result of the measurement about the two-layer laminated films, its magnetostrictive constant was reduced in comparison with single-layer CoFeB. But an extent of the reduction was not sufficient. Further, in comparison with the single-layer CoFeB, the MR ratio of the two-layer laminated films was fallen down sharply. FIGS. 7 and 8 show the result of measurements about the magnetostrictive constant and MR ratio concerning the laminated films "CoFeB/NiFe" in which the amount of addition of boron "B" is changed. In the change characteristic 61 shown in FIG. 7, when boron B was added, the value of the magnetostrictive constant could fall to about $2.5 \times 10^{-6}$. However, it could not be lowered below the value, and further could not be made smaller than the required value $1.0 \times 10^{-6}$. In addition, as shown by the change characteristic 62 of FIG. 8, when the amount of addition of boron B was increased, the MR ratio was further fallen down and as a result it was fallen down to about 23% at 20% as the amounts of addition of B.

OBJECTS AND SUMMARY

An object of the present invention is to provide a magnetoresistance effect device capable of reducing a magnetostrictive constant with a MR ratio maintained to be high in view of the above-mentioned subject.

Another object of the present invention is to provide a magnetoresistance effect device with the value of the absolute value of the magnetostrictive constant smaller than $1.0 \times 10^{-6}$ desirably, maintaining a MR ratio to be high.

A magnetoresistance effect device in accordance with an embodiment of the present invention is configured as follows in order to attain the above-mentioned objects.

A first magnetoresistance effect device includes a fixed ferromagnetism layer, a free ferromagnetism layer and a barrier layer sandwiched by both the ferromagnetism layers, and CoFeB in which an amount (b: atomic percent (%)) of addition of boron B satisfies the condition of 21%≦b≦23% is used for the free ferromagnetism layer.

A second magnetoresistance effect device includes a fixed ferromagnetism layer, a free ferromagnetism layer and a barrier layer sandwiched by both the ferromagnetism layers, and CoNiFeB in which an amount (a: atomic %) of addition of nickel Ni satisfies the condition of 5%≦a≦17% is used for the free ferromagnetism layer.

In the first or second magnetoresistance effect device, the barrier layer preferably contains a MgO layer.

According to an embodiment of the present invention, in the magnetoresistance effect device having the fixed ferromagnetism layer, the free ferromagnetism layer and the barrier layer sandwiched by the ferromagnetic layers, the value of the magnetostrictive constant can be controlled to be less than $\pm 1.0 \times 10^{-6}$, with a MR ratio maintained to be high.

BRIEF EXPLANATION OF THE DRAWINGS

The objects and features of the present invention are clarified by the following arts based on preferable embodiments shown in the attached drawings explained below.

DESCRIPTION OF THE PREFERRED EMBODIMENTS

Hereinafter, preferred embodiments of the present invention will be explained in accordance with the attached drawings.

Figure 1:
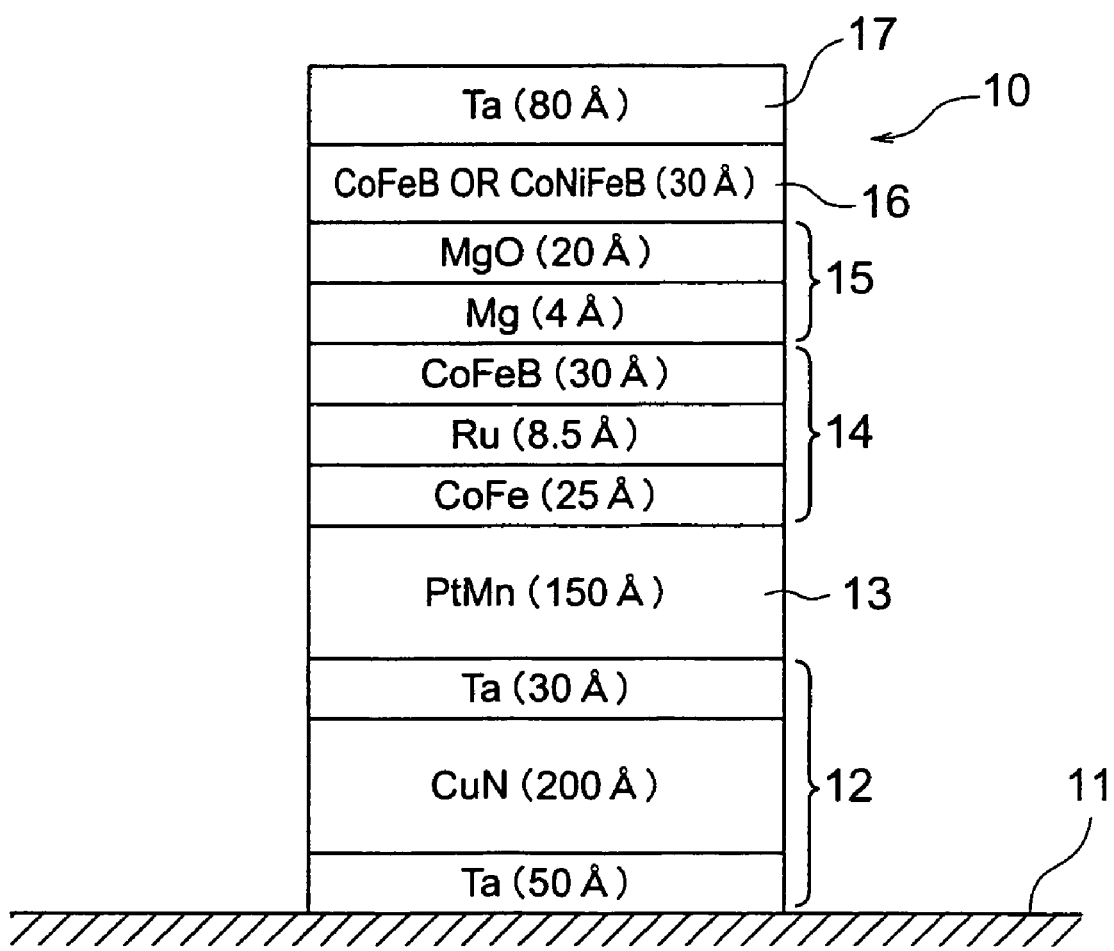
FIG. 1 is a structural view showing a laminating structure of a magnetoresistance effect device in accordance with a typical embodiment of the present invention.

In FIG. 1, in accordance with this magnetoresistance effect device 10, a multilayer film with eleven layers, which forms the magnetoresistance effect device 10, is deposited on a substrate 11. The substrate 11 is made by silicon material or the like. The magnetoresistance effect device 10 is drawn so that the laminating structure thereof may be clarified, and further the spread portions of the transverse direction in the right-and-left both sides are omitted in FIG. 1. In accordance with the multilayer film with the eleven layers, in the direction from the first layer of the bottom layer to the eleventh layer of the top layer, the layered magnetism films are formed in an order of "Ta", "CuN", "Ta", "PtMn", "CoFe", "Ru", "CoFeB", "Mg", "MgO", "CoFeB or CoNiFeB", and "Ta". The layers from the first layer (Ta: tantalum) to the third layer form a ground layer 12. The fourth layer (PtMn: Platinum Manganese) is an anti-ferromagnetism layer 13. The region including the fifth layer to the seventh layer (CoFe, Ru and CoFeB) forms a fixed ferromagnetism layer 14. The eighth layer (Mg: Magnesium) and the ninth layer (MgO: Magnesium Oxide) form an insulated layer (or barrier layer) 15 which is a tunnel barrier layer. The tenth layer (CoFeB or CoNiFeB) is a free ferromagnetism layer 16.

The barrier layer comprising the eighth layer (Mg) and the ninth layer (MgO) is sandwiched between the two ferromagnetic layers, that is, the fixed ferromagnetism layer (CoFeB) and the free ferromagnetism layer (CoFeB or CoNiFeB).

The eleventh layer (Ta: tantalum) forms an oxidization prevention layer 17.

In accordance with the three-layer structure composed of the above-mentioned fixed ferromagnetism layer, barrier layer and free ferromagnetism layer, the magnetoresistance effect device is formed as a fundamental structure in a narrow sense. The seventh layer "CoFeB" which is the fixed ferromagnetism layer is known as a ferromagnetic substance having amorphous state in the as-deposited state. The MgO layer which is the tunnel barrier layer is formed so that it may have single crystal structure or high orientation polycrystal structure (fiber texture) in which there is no grain boundary in a thickness direction.

In addition, the numerical value indicated in the parenthesis in each layer in FIG. 1 shows the thickness of each layer, and a unit thereof is "Angstrom (Å)". The numeral values for indicating the thickness are respectively one example and the thickness of each layer is not limited to the above numerical value.

The above-mentioned magnetoresistance effect device 10 is a spin-valve type magnetism tunnel junction device on the basis of causing a tunnel barrier layer to be the MgO layer.

Figure 2:
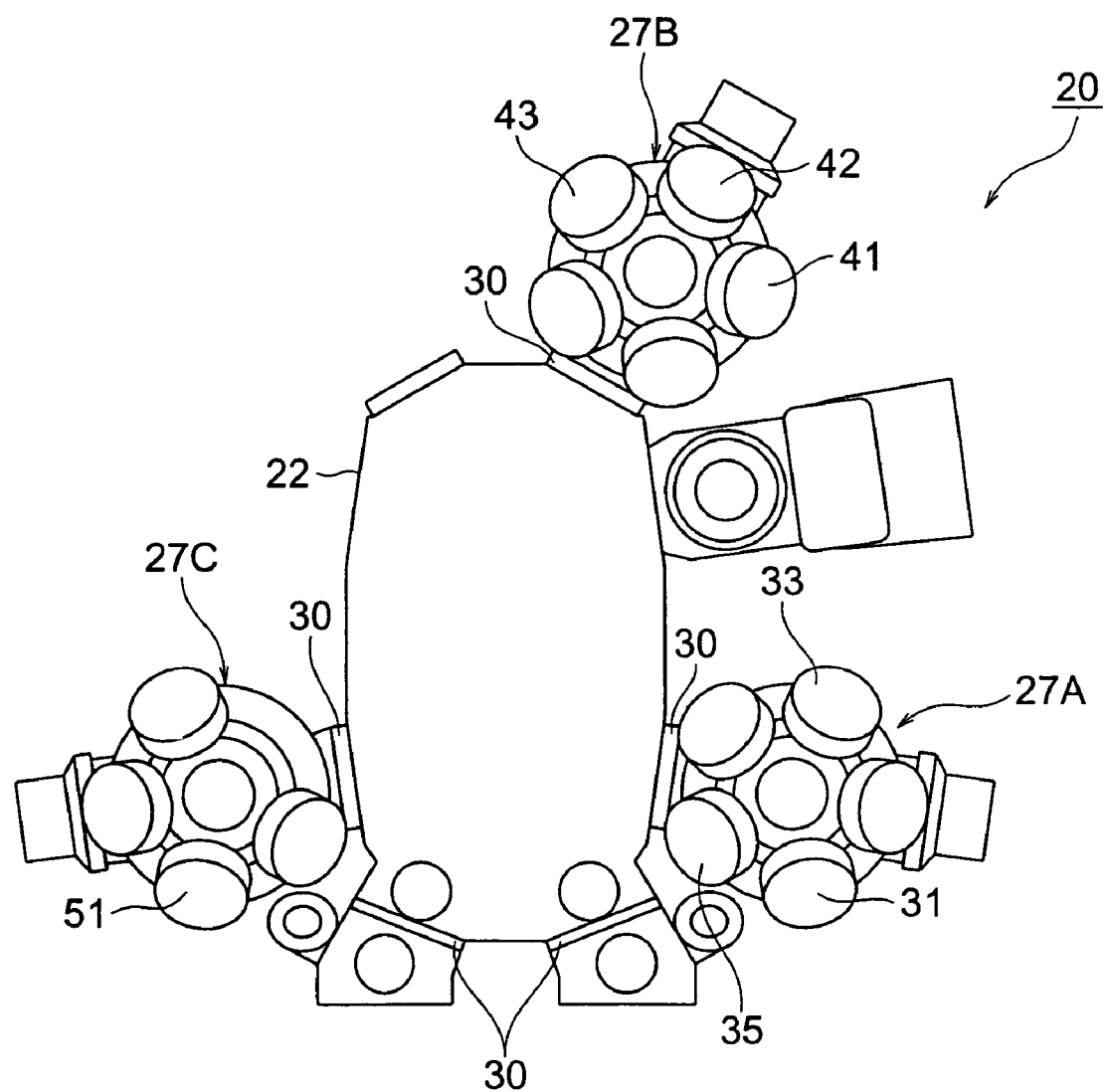
FIG. 2 is a plane view of magnetic multilayer film production equipment for producing the magnetoresistance effect device of the present embodiment.

Next, it will be roughly explained about an equipment for manufacturing the magnetoresistance effect device 10 having the above-mentioned laminating structure, and the manufacturing method, with reference to FIG. 2.

FIG. 2 shows a plane view of a magnetism-multilayer film production equipment for producing the magnetoresistance effect device of the present embodiment. The magnetism-multilayer film production equipment 20 for manufacturing the above-mentioned magnetoresistance effect device 10 is cluster-type equipment, and is equipped with two or more film deposition chambers based on the sputtering method, etc.

In the magnetism-multilayer film production equipment 20, there are three film deposition chambers 27A, 27B and 27C around a transfer chamber 22. There is a gate valve 30 between two chambers. The gate valve 30 isolates one chamber from another chamber, and can be freely opened or closed as the need arises. In addition, each of the above chambers is provided with not shown vacuum evacuation unit, gas introduction mechanism and electric power supply mechanism, etc. In each of the film deposition chambers 27A, 27B and 27C of the magnetism-multilayer film production equipment 20, each of the above-mentioned magnetism film is deposited on the substrate one by one by the sputtering method. In the equipment 20, for example, material of a target 31 is "Ta", material of a target 33 is "CoFeB", and material of a target 35 is "Ni". Moreover, material of a target 41 is "PtMn", material of a target 42 is "CoFe", and material of a target 43 is "Ru". Furthermore, material of a target 51 is "MgO".

When the free ferromagnetism layer 16 is a CoFeB film, the target of "CoFeB" is used for the sputtering. When the layer 16 is a CoNiFeB film, the target of "CoFeB" (cobalt iron boron) and the target of nickel "Ni" are simultaneously used for the sputtering.

In accordance with the magnetism-multilayer film production equipment 20 with the above-mentioned configuration, the magnetism-multilayer film shown in FIG. 1 has been deposited on the substrate in order by the sputtering method using each of the film deposition chambers 27A, 27B and 27C.

The magnetoresistance effect device 10, in which the laminating process is completed by the sputtering in each of the film deposition chambers 27A, 27B and 27C, is annealed in a heat treatment furnace thereafter. In this case, for example, annealing temperature is about 300° C., the annealing processing is performed for four hours in the circumstance of the magnetic field of 8 kOe. Thereby, necessary magnetization alignment is given to the PtMn layer of the magnetoresistance effect device 10.

Next, it will be explained about composition of the first example concerning the above-mentioned free ferromagnetism layer 16. The atomic composition of the free ferromagnetism layer 16 is expressed as $Co_xFe_yB_b$. In this case, the suffixes x, y and b imply the amount of addition (content) of cobalt Co, Iron Fe and boron B, respectively, and are expressed as "atomic % (at. %)".

In the above, the optimal amount (b: atomic %) of addition of boron B in $Co_xFe_yB_b$ which is the free ferromagnetism layer 16 satisfies the condition of 21%≦b≦23%.

Figure 3:
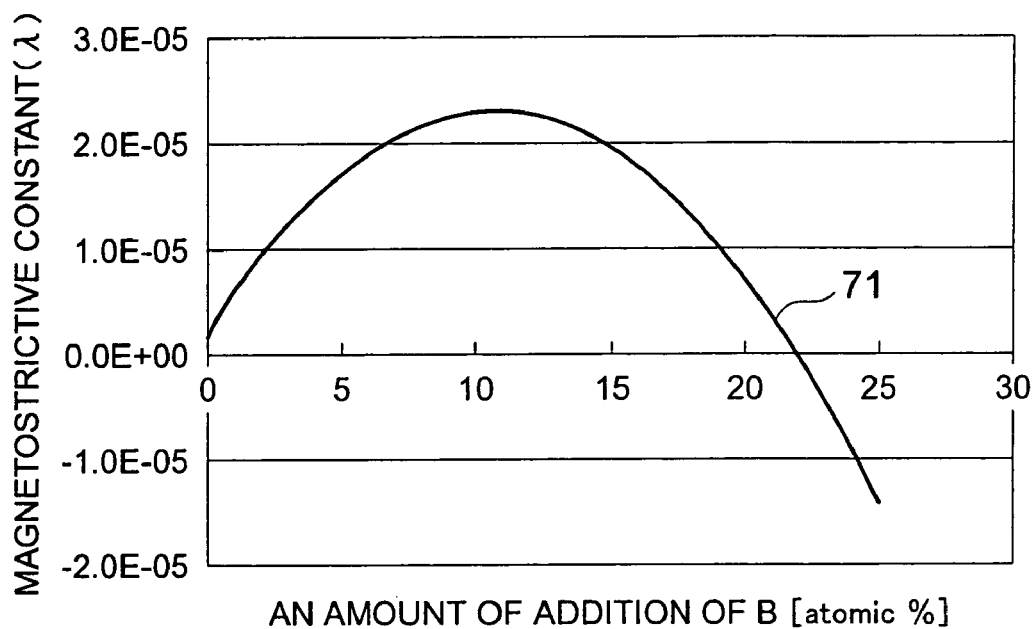
FIG. 3 is a graphic view showing a change characteristic of magnetostrictive constant ($\lambda$) depending on the amount of addition of boron (B) in the magnetoresistance effect device of the first embodiment of the present invention.
Figure 4:
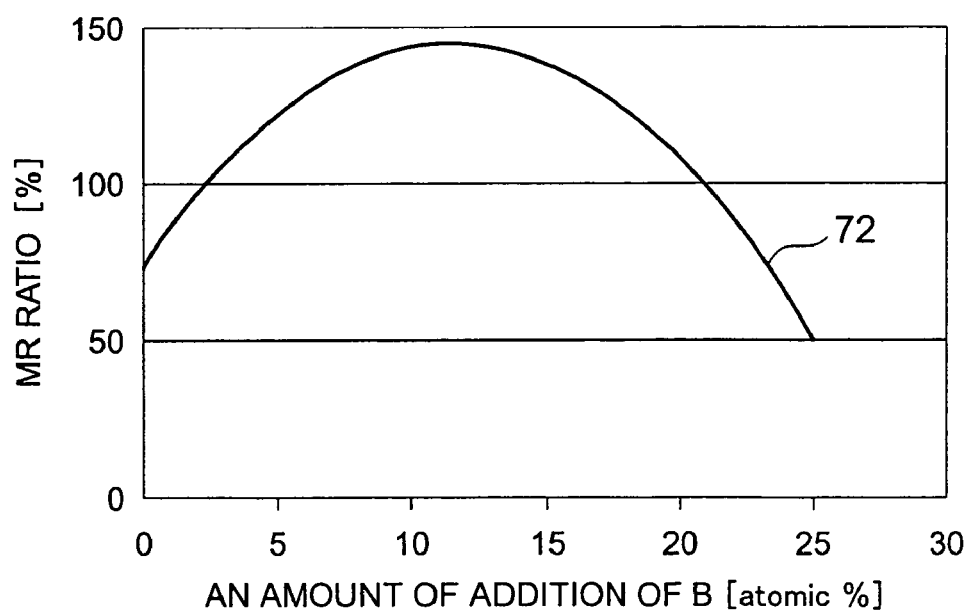
FIG. 4 is a graphic view showing a change characteristic of MR ratio depending on the amount of addition of boron (B) in the magnetoresistance effect device of the first embodiment of the present invention.

It will be explained about the reason that the above-mentioned condition is obtained with reference to FIGS. 3 and 4. FIG. 3 shows a change characteristic 71 of the magnetostrictive constant (λ) to the amount of addition of boron B in the free ferromagnetism layer 16 (the tenth layer: "CoFeB") in the magnetoresistance effect device 10 having the multilayer film structure mentioned above. The horizontal axis shown in FIG. 3 implies the amount of addition of boron B. FIG. 4 shows a change characteristic 72 of MR ratio (magnetic resistance ratio: %) to the amount of addition of boron B in the free ferromagnetism layer 16 (the tenth layer: "CoFeB") concerning the magnetoresistance effect device 10.

In accordance with the change characteristic 71 shown in FIG. 3, it is found out that the value of the magnetostrictive constant (λ) increases as the amount of addition of boron B is increased, and it begins to decrease after a peak when the amount of addition of boron B is included in the range of 10-15 (atomic %). The value of the magnetostrictive constant comes to zero (about $4\times10^{-8}$) when the amount of addition of boron B is about 22 (atomic %). Further, it is found out that the value of the magnetostrictive constant begins to be minus, when the amount of addition of boron B is increased more that 22 (atomic %). When the amount (b: atomic %) of addition of boron B satisfied the condition of 21%≦b≦23%, the value of the magnetostrictive constant could be maintained within a range less than to about $\pm1.0\times10^{-6}$.

On the other hand, in accordance with the change characteristic 72 shown in FIG. 4, it was found out that the value of MR ratio took a big value included in a range of 60-100%, when the amount (b: atomic %) of addition of boron B satisfied the condition of 21%≦b≦23%.

In accordance with the change characteristic 71 shown in FIG. 3 and the change characteristic 72 shown in FIG. 4, the value of the magnetostrictive constant (λ) could be controlled to be less than $\pm1.0\times10^{-6}$ maintaining the MR ratio of high value of 60% or more, because of using the free ferromagnetism layer (CoFeB) 16 containing the boron B in which the amount (b) of addition of boron B satisfies the condition of the condition of 21%≦b≦23%, as shown in each graph shown in the drawings.

Next, it will be explained about composition of the second example concerning the free ferromagnetism layer 16. The atomic composition of the free ferromagnetism layer 16 is expressed as $Co_xNi_aFe_yB_z$. In this case, the suffixes a, x, y and z imply the amount of addition (content) of nickel Ni, cobalt Co, Iron Fe and boron B, respectively, and are expressed as "atomic % (at. %)".

In the above, the optimal amount (a: atomic %) of addition of the nickel Ni in $Co_xNi_aFe_yB_z$ which is the free ferromagnetism layer 16 is preferably in a range of 5%≦a≦17%.

Figure 5:
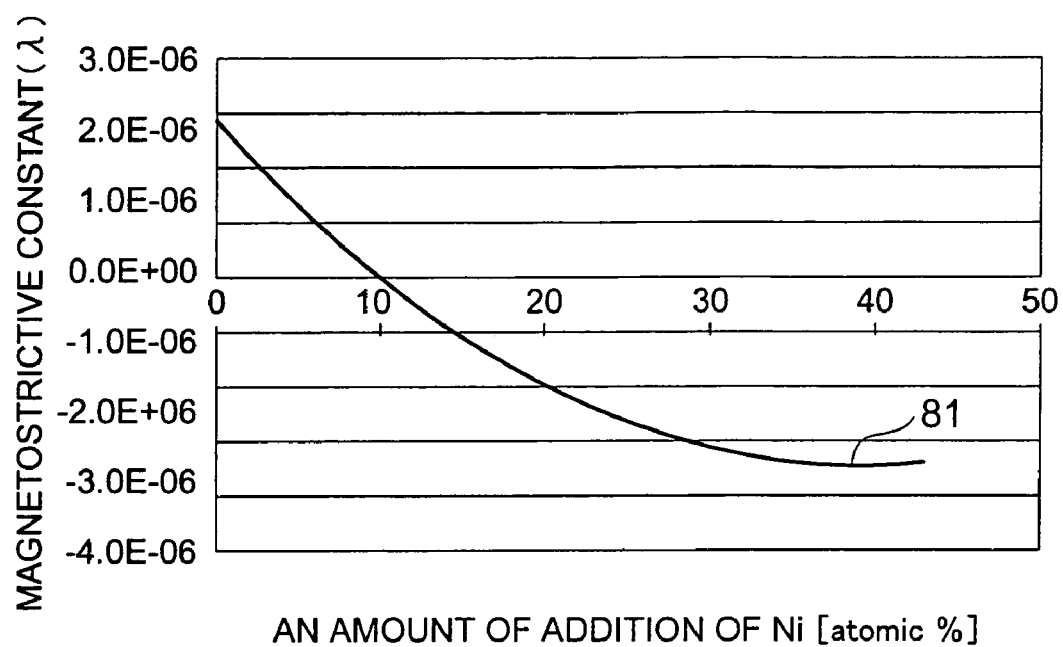
FIG. 5 is a graphic view showing a change characteristic of magnetostrictive constant ($\lambda$) depending on the amount of addition of nickel (Ni) in the magnetoresistance effect device of the second embodiment of the present invention.
Figure 6:
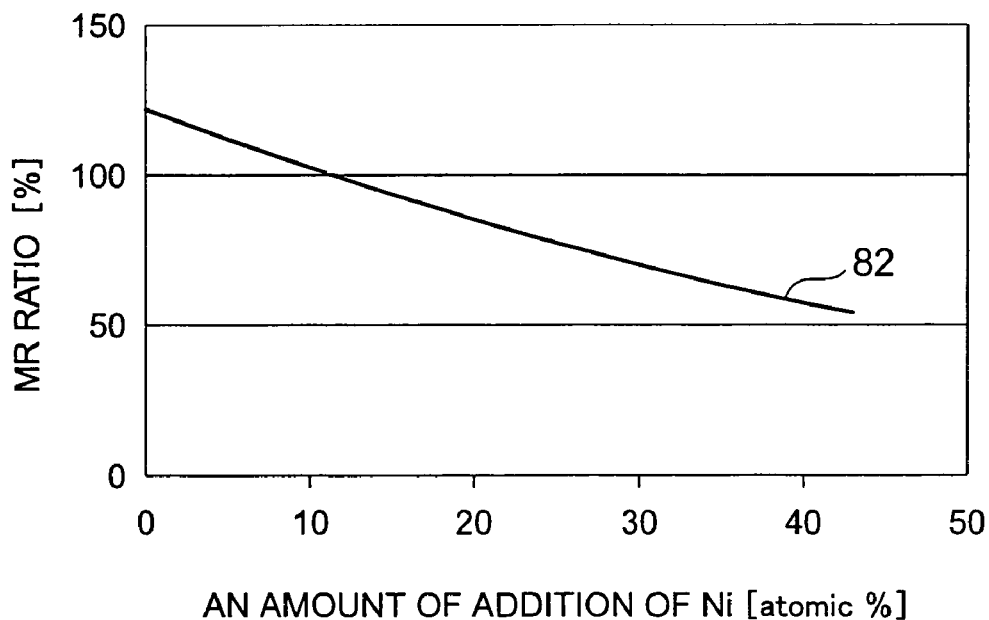
FIG. 6 is a graphic view showing a change characteristic of MR ratio depending on the amount of addition of nickel (Ni) in the magnetoresistance effect device of the second embodiment of the present invention.
Figure 7:
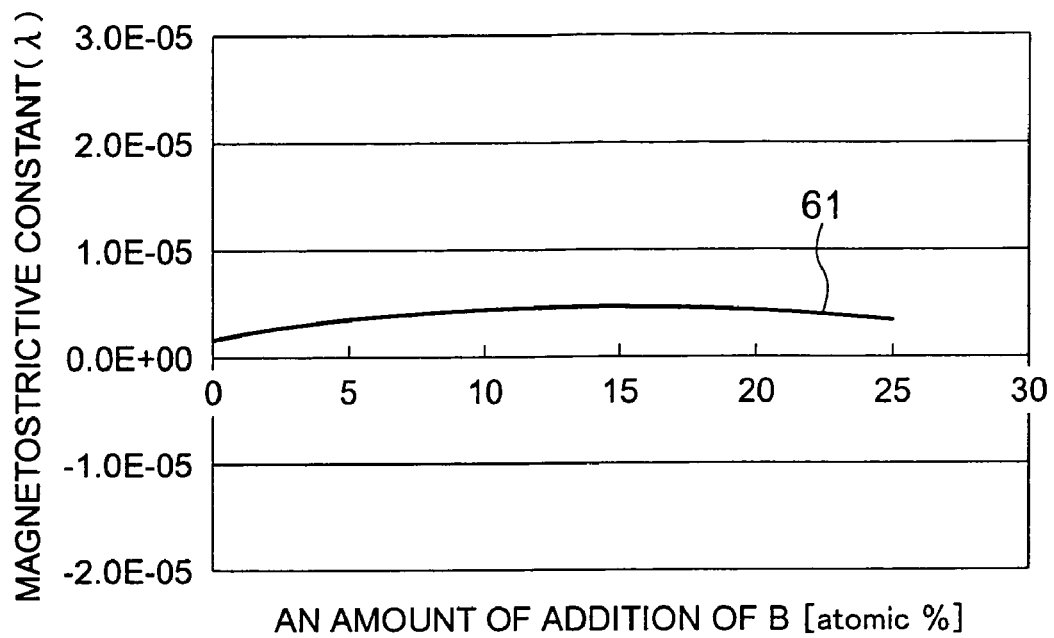
FIG. 7 is a graphic view showing a change characteristic of magnetostrictive constant ($\lambda$) depending on the amount of addition of boron (B) in the magnetoresistance effect device in which the free ferromagnetism layer is a laminated film "CoFeB/NiFe"
Figure 8:
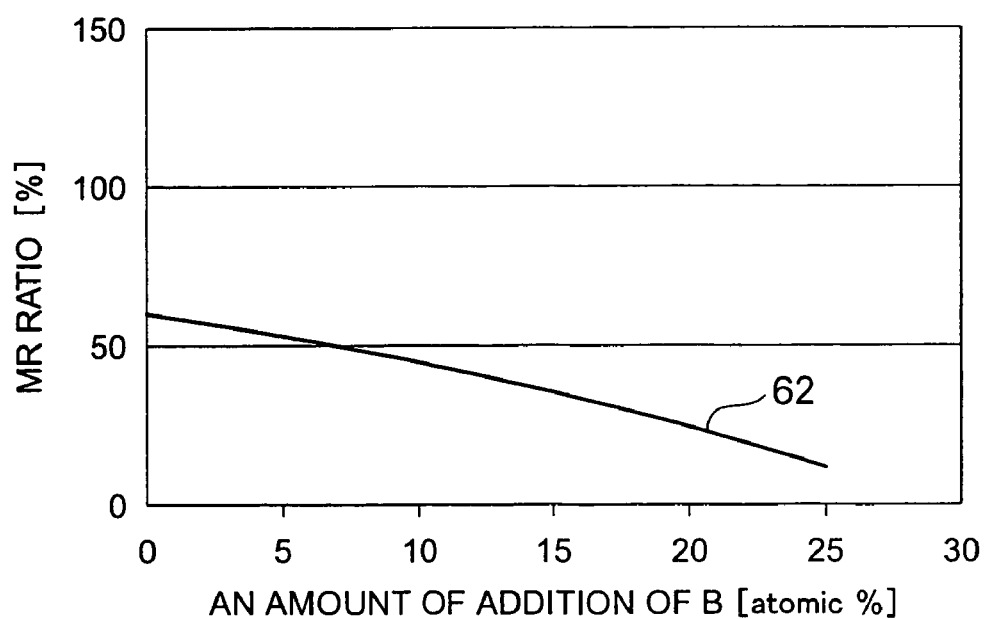
FIG. 8 is a graphic view showing a change characteristic of MR ratio depending on the amount of addition of boron (B) in the magnetoresistance effect device in which the free ferromagnetism layer is a laminated film "CoFeB/NiFe".

Next, the reason why the above condition is found out will be explained with reference to FIGS. 5 and 6. FIG. 5 shows a change characteristic 81 of the magnetostriction constant (λ) to the amount of addition of the nickel Ni (horizontal axis) of the free ferromagnetism film (the tenth layer "CoNiFeB") in the magnetoresistance effect device 10 having the multilayer film structure mentioned above. FIG. 6 shows a change characteristic 82 of MR ratio (magnetic resistance ratio: %) to the amount of addition of nickel Ni in the free ferromagnetism layer 16 (the tenth layer: "CoNiFeB") in the magnetoresistance effect device 10.

In the change characteristic 82 shown in FIG. 6, when the amount of addition of nickel Ni is relatively small, the value of MR ratio is larger than 100%, and the MR ratio hardly falls. On the other hand, in the change characteristic 81 shown in FIG. 5, the value of the magnetostrictive constant (λ) is gradually decreased from the value (about $2\times10^{-6}$) in case that the amount of addition of nickel is 0 (atomic %), when the amount of the addition of nickel is gradually increased. Further, when the amount of addition of nickel Ni is 11 (atomic %), the value of the magnetostrictive constant, the amount of addition of nickel Ni comes to be zero (about $4\times10^{-8}$ atomic %). Then, the value of the magnetostrictive constant becomes a minus value, and it decreases gradually to be about $-3\times10^{-6}$ until the amount of addition of nickel (Ni) results in the value of 30 (atomic %). Moreover, in the spots near the place that the magnetostrictive constant is zero, it turns out that the value of the magnetostrictive constant (λ) changes gently-sloping according to the change of the amount of addition of nickel Ni.

In accordance with the change characteristic 81 shown in FIG. 5 and the change characteristic 82 shown in FIG. 6, as shown in the graph of each drawing, it is desirable to use the free ferromagnetism layer (CoNiFeB) containing nickel Ni in which the amount of addition (a) is in a range of 5%≦a≦17%. By satisfying the condition, MR ratio could be maintained to be the high value of 90-110%, and with this state of the MR ratio the magnetostrictive constant (λ) is controlled to be less than $\pm1.0\times10^{-6}$ under good controllability. When the amount of addition of nickel Ni is less than 5%, the magnetostrictive constant (λ) becomes larger than $+1.0\times10^{-6}$, and further on the other hand, when it is larger than 17%, the magnetostrictive constant (λ) becomes smaller than $-1.0\times10^{-6}$.

In accordance with the above-mentioned embodiment, it has been explained about an example of the MgO film in which the barrier layer is the single crystal structure or the high orientation polycrystal structure (the fiber texture) having no grain boundary in the thickness direction. However, embodiments of the present invention are not limited to the above embodiment. That is, the MgO film of the present invention is not limited to the single crystal or the high orientation polycrystal structure. The MgO film may have the characteristic of a stratified crystal, amorphous or the like. Moreover, a barrier layer may be not the MgO film but an AlO film or a TiO film. Furthermore, although the barrier layer is MgO/Mg in the present embodiment, it may be MgO single layer. Furthermore, the structure of the magnetoresistance effect device 10 is not limited to the bottom type structure formed in order of the fixed ferromagnetism layer, the barrier layer and the free ferromagnetism layer. It may be applied to the top type structure that is reversed the upper and lower sides and is formed in order of the free ferromagnetism layer, the barrier layer and the fixed ferromagnetism layer. In this case, an equivalent effect can be acquired.

The configurations, shapes, sizes and layouts explained in the embodiments are only shown schematically to an extent enabling the present invention to be understood and worked. Further, the numerical values and compositions (materials) are only shown for illustration. Therefore, the present invention is not limited to the explained embodiments, and can be changed in various ways within the scope of the technical ideas shown in the claims.

The present invention contains subject matter related to Japanese Patent Application No. 2005-279559 filed on Sep. 27, 2005 in the Japanese Patent Office, entire contents of which being incorporated herein by reference.

The invention claimed is:

1. A magnetoresistance effect device comprising:
   a fixed ferromagnetism layer including an Ru layer positioned on a substrate side and a CoFeB layer formed onto said Ru layer,
   a free ferromagnetism layer including CoFeB, and
   a barrier layer including crystal magnesium oxide sandwiched by said fixed ferromagnetism layer and said free ferromagnetism layer,
   wherein said CoFeB layer in said fixed ferromagnetism layer is positioned on a barrier layer side so as to be in contact with said barrier layer, a layer of said crystal magnesium oxide in the barrier layer is formed so as to have a single structure or high orientation polycrystal structure having no grain boundary in a thickness direction, and said CoFeB in which an amount (b: atomic %) of addition of boron (B) satisfies a condition of $21\% \leqq b \leqq 23\%$ is used for said free ferromagnetism layer.

2. The magnetoresistance effect device as set forth in claim 1, wherein said barrier layer contains only said crystal magnesium oxide.

3. A magnetoresistance effect device comprising:
   a fixed ferromagnetism layer including an Ru layer positioned on a substrate side and a CoFeB layer formed onto said Ru layer,
   a free ferromagnetism layer including CoNiFeB, and
   a barrier layer including crystal magnesium oxide sandwiched by said fixed ferromagnetism layer and said free ferromagnetism layer,
   wherein said CoFeB layer in said fixed ferromagnetism layer is positioned on a barrier layer side so as to be in contact with said barrier layer, a layer of said crystal magnesium oxide is formed so as to have a single structure or high orientation polycrystal structure having no grain boundary in a thickness direction, and said CoNiFeB in which an amount (a: atomic %) of addition of nickel (Ni) satisfies a condition of $5\% \leqq b \leqq 17\%$ is used for said free ferromagnetism layer.

4. The magnetoresistance effect device as set forth in claim 3, wherein said barrier layer contains only said crystal magnesium oxide.

* * * * *